(12) United States Patent
Pedoeem et al.

(10) Patent No.: US 7,436,660 B2
(45) Date of Patent: Oct. 14, 2008

(54) HEAT SINKS FOR ELECTRONIC ENCLOSURES

(75) Inventors: Albert Pedoeem, West Orange, NJ (US); Kriss K. Replogle, Brookside, NJ (US)

(73) Assignee: Fujitsu Limited, Kawasaki (JP)

( * ) Notice: Subject to any disclaimer, the term of this patent is extended or adjusted under 35 U.S.C. 154(b) by 64 days.

(21) Appl. No.: 11/637,840

(22) Filed: Dec. 13, 2006

(65) Prior Publication Data

US 2007/0171614 A1    Jul. 26, 2007

Related U.S. Application Data

(60) Provisional application No. 60/749,577, filed on Dec. 13, 2005.

(51) Int. Cl.
*H05K 7/20* (2006.01)
(52) U.S. Cl. .................. 361/690; 361/692; 361/693; 361/704; 174/16.1; 174/16.3; 165/80.3
(58) Field of Classification Search .................. None
See application file for complete search history.

(56) References Cited

U.S. PATENT DOCUMENTS

| | | | | |
|---|---|---|---|---|
| 4,557,225 A | * | 12/1985 | Sagues et al. | 123/41.31 |
| 4,858,069 A | * | 8/1989 | Hughes | 361/696 |
| 5,105,336 A | * | 4/1992 | Jacoby et al. | 361/690 |
| 5,280,191 A | * | 1/1994 | Chang | 257/712 |
| 5,812,373 A | * | 9/1998 | Hwang | 361/704 |
| 5,825,621 A | * | 10/1998 | Giannatto et al. | 361/701 |
| 5,831,830 A | * | 11/1998 | Mahler | 361/704 |
| 5,953,207 A | * | 9/1999 | Aakalu et al. | 361/690 |
| 6,002,585 A | * | 12/1999 | Leeb | 361/690 |
| 6,038,129 A | * | 3/2000 | Falaki et al. | 361/699 |
| 6,101,090 A | * | 8/2000 | Gates | 361/690 |
| 6,434,000 B1 | * | 8/2002 | Pandolfi | 361/685 |
| 6,972,959 B2 | * | 12/2005 | Asai et al. | 361/719 |
| 7,095,611 B2 | * | 8/2006 | Kunz | 361/687 |
| 7,154,755 B2 | * | 12/2006 | Araujo | 361/720 |
| 7,158,380 B2 | * | 1/2007 | Green et al. | 361/704 |
| 7,322,850 B2 | * | 1/2008 | Neer et al. | 439/567 |
| 2002/0141159 A1 | * | 10/2002 | Bloemen | 361/704 |
| 2008/0068807 A1 | * | 3/2008 | Horng et al. | 361/719 |

\* cited by examiner

*Primary Examiner*—Boris L Chervinsky
(74) *Attorney, Agent, or Firm*—Hanify & King, P.C.

(57) ABSTRACT

An apparatus for cooling electronics is disclosed. The apparatus generally relates to heat sinks that are operatively connected to electronics enclosures. The heat sinks may be part of the electronics enclosure, or alternately they may be operatively connected to the electronics enclosure. An enclosure preferably prevents solar radiation from striking the surface of the heat sink. At the same time, the enclosure allows air to flow over the heat sink, allowing heat to be dissipated.

19 Claims, 3 Drawing Sheets

HEAT SINKS FOR ELECTRONIC ENCLOSURES

CROSS-REFERENCE TO RELATED APPLICATIONS

The present invention claims priority to U.S. Provisional Patent Application Ser. No. 60/749,577, filed Dec. 13, 2005, the entirety of which is incorporated herein by reference.

FIELD OF THE INVENTION

The present invention relates to enclosures for electronic equipment and devices. More specifically, the present invention relates to an apparatus for combining a heat sink with an electronic enclosure.

BACKGROUND OF THE INVENTION

Over the past 50 years, electronic equipment has become more and more prevalent in the average person's everyday life. With the invention of the transistor, electronics have rapidly become more and more powerful and sophisticated. At the same time, advances in technology have allowed electronics to penetrate nearly every aspect of our everyday lives. The home is no exception.

Increasingly, electronic equipment has allowed us to communicate with one another, or to receive other types of media services such as television, telephone service, internet, and satellite service. To provide these services, media providers often run cables of varying types from remote locations to individual homes. The cables, of varying types, allow individuals to receive telephone, internet, and cable service.

Each individual home or unit has an interface, referred to as a Network Interface Device (NID), located outside that allows a home's internal wiring to communicate with the cables from the media providers. The interface typically includes electronic equipment and circuitry. The nature of electrical circuitry requires that it be protected from the outside environment in order to function properly. As such, different enclosures have been devised in order to protect this equipment from the elements, such as wind, water, dust, and heat.

Overheating of equipment due to solar radiation, and heat generated by the electrical equipment itself, is the source of significant problems. Electrical equipment that overheats can malfunction, which results in costly repairs. To avoid overheating, enclosures employ a wide variety of techniques in an attempt to maintain an ambient temperature within an enclosure. This problem is not as prevalent with indoor electrical enclosures, which are currently more widespread, because these enclosures do not need to be sealed and are not exposed to solar radiation.

Although the outdoor Network Interface Device (NID), the housing for the demarcation point, is a mature technology, the inclusion of heat-dissipating and environmentally sensitive electronics and opto-electronics in particular in outdoor NID-like applications is a relatively new application. Previous outdoor applications have addressed the cooling problem by packaging the electronics in an enclosure that is larger in surface area, and hence less desirable by the customer, than is otherwise necessary for the physical packaging of the electronics and associated hardware. Prior art enclosures have also been designed to limit air intake to the bottom surface of an enclosure, and air exhaust to the top of the enclosure.

A drawback of more compact enclosures currently available is that they result in operating conditions for the electronic devices that are hotter than desirable under worst case environmental conditions and will reduce the life and reliability of the system below desirable levels. Higher power applications typically employ expensive and power-hungry cooling fans.

A continuing need exists for a low cost electrical enclosure that is capable of efficiently cooling electronic equipment. Moreover, a continuing need also exists for an electrical enclosure that can shield sensitive electronic equipment from solar radiation.

SUMMARY OF THE INVENTION

The present invention consists of a method and apparatus for mounting and cooling electronic equipment in a low-cost, preferably plastic, environmentally protected inner enclosure. In one embodiment, the inner enclosure includes a sealed component and a ventilated component. The inner enclosure is preferably surrounded by an outer enclosure. The inner enclosure preferably houses electronic devices. The cavity of the exterior mounting bracket, which is included in the outer enclosure, is ventilated by outside air via natural convection.

In one embodiment, the inner enclosure comprises a fin-type heat sink of the rear facing surface which mates with the surface of the sealed component. The mating between the fins of the heat sink and the sealed component maximizes the area for heat transfer while maintaining environmental isolation of the electronics from outdoor contaminants. In another embodiment, the heat sink may be a separate element that is attached to the ventilated component and the rear wall of the sealed component. One advantage of the present invention is that the rear surface of the inner enclosure is not exposed to solar radiation and yet, with adequate ventilation of the mounting bracket, can be exposed to cooling air near the outdoor ambient temperature.

According to one aspect, the present invention comprises an apparatus for cooling electronics. The apparatus may include an enclosure comprising a first compartment that includes electronics therein, and a second compartment. The second compartment preferably comprises an opening in one wall, and a portion of the first compartment may be selectively positioned within a cavity of the second compartment. The apparatus also includes a heat sink that is operatively connected to a portion of the first compartment and a portion of the second compartment. It is desirable for the operative connection between the heat sink and the portion of the second compartment to form a seal.

In one embodiment, the apparatus may also include an outer enclosure operatively connected to the second compartment to surround the wall of the second compartment that has an opening. Preferably, the outer enclosure comprises a plurality of perforations through which air may flow. The connection between the outer enclosure and the second compartment preferably forms a cavity into which the heat sink protrudes. Within this cavity, the exposure of the heat sink to solar radiation is substantially minimized. At the same time, heat may be transferred from the heat sink to air in the cavity via convection. To improve heat transfer, the electronics are operatively connected to the first compartment using one or more thermal conductive bonds. To further facilitate heat transfer, a portion of the first compartment that is exposed to the cavity of the second component comprises two or more perforations.

According to another aspect, the present invention comprises an apparatus for cooling electronic devices. The apparatus includes a first enclosure comprising a heat sink, and a portion of the first enclosure houses electronics therein. Also included is a second sealed enclosure that surrounds the first enclosure, and the heat sink of the first enclosure is operatively connected to a portion of the second sealed enclosure. Preferably, the heat sink comprises a plurality of protrusions and the portion of the second sealed enclosure operatively connected to the protrusions is configured and dimensioned to include a plurality of recesses that correspond to the plurality of protrusions.

In one embodiment, the apparatus further comprises a thermal bond between the electronics and the heat sink to facilitate heat transfer. It may be desirable for the second sealed enclosure to comprise plastic. To account for differential thermal expansion that occurs when the heat sink comprises a different material than the second enclosure, the apparatus may comprise a gap between the top of each of the plurality of protrusions and the bottom of each of the plurality of recesses. The heat sink may also have a plurality of recesses between the plurality of protrusions, and the second sealed enclosure includes a plurality of protrusions corresponding to the plurality of recesses. As such, the apparatus further comprises a gap between the bottom of each of the plurality of recesses of the heat sink and the top of the plurality of protrusions of the second sealed enclosure.

It is desirable for the apparatus to further comprise a third enclosure having a plurality of perforations operatively connected to the second enclosure to form a cavity therebetween. In one embodiment, at least a portion of the heat sink protrudes into the cavity. In this manner, the exposure of the heat sink to solar radiation is substantially minimized. At the same time, heat may be transferred from the heat sink to air in the cavity via convection. To aid in heat transfer, the first enclosure may comprise a plurality of perforations.

According to another aspect, the present invention comprises an apparatus for cooling electronics that includes a first enclosure comprising a heat sink. Preferably, a portion of the first enclosure houses electronics therein. Also included is a second enclosure surrounding the first enclosure. It is desirable for the heat sink of the first enclosure to contact a portion of the second enclosure. In one embodiment, the surface of the heat sink that contacts a portion of the second enclosure is non-planar. The apparatus may also include a third enclosure that includes a plurality of perforation operatively connected to the second enclosure to form a cavity therebetween.

BRIEF DESCRIPTION OF THE DRAWINGS

Further features and advantages of the invention can be ascertained from the following detailed description that is provided in connection with the drawings described below.

DETAILED DESCRIPTION OF THE PREFERRED EMBODIMENTS

Figure 1:
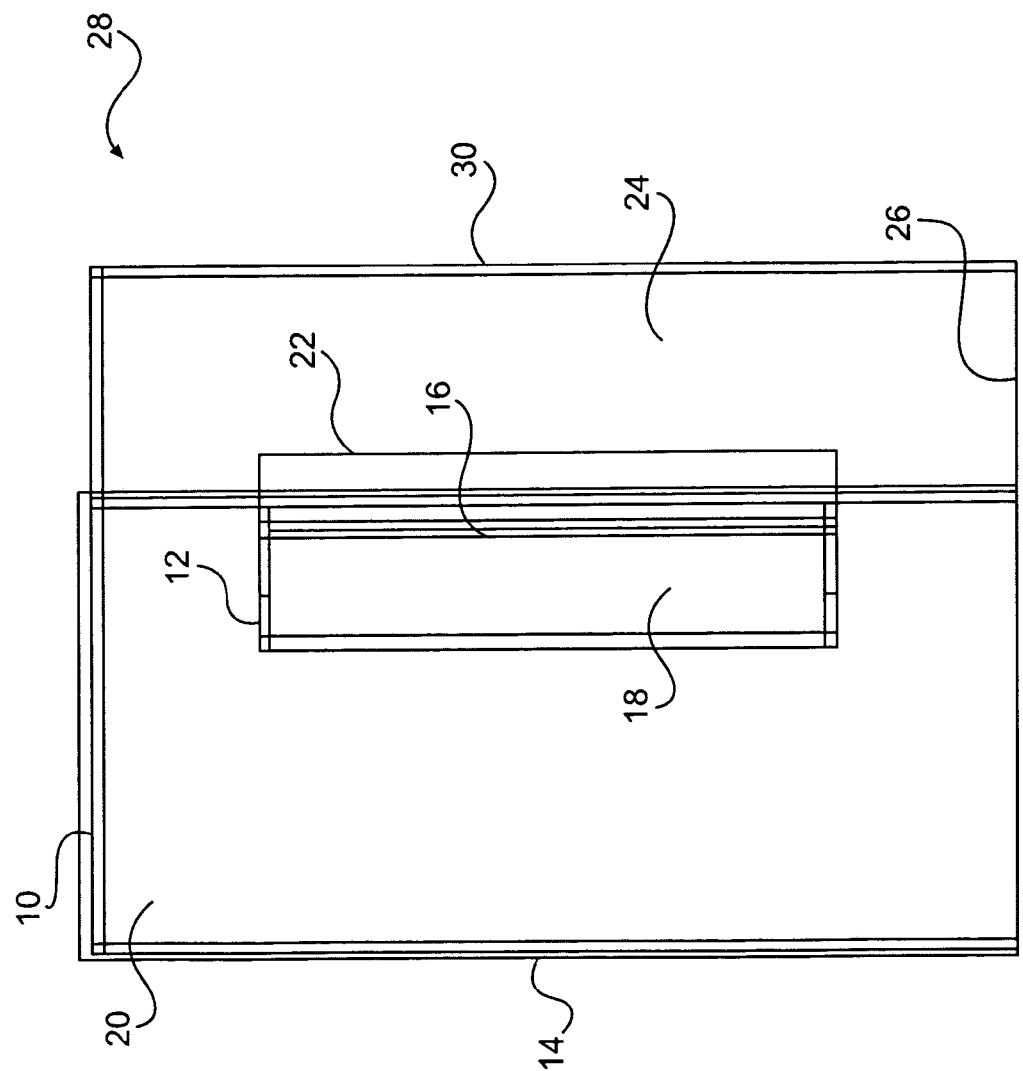
FIG. 1 shows an overview of one exemplary embodiment of the present invention.

Manufacturers of electrical enclosures prefer to produce the enclosures in high volume in order to reduce their cost. This requirement tends to favor a molded plastic enclosure cooled by natural convection, although such a design does not dissipate the internally generated heat of the electronics effectively enough for a compact design with long life. The housing of electronic equipment on the exterior of a residence for applications such as fiber to the premises introduces a cooling problem due to the following requirements: (i) compact packaging; (ii) sealing against contamination; (iii) additional thermal loading from solar radiation; (iv) low cost due to widespread deployment; and (v) low maximum device temperatures for maximum life and reliability. Temperature rise due to solar heating is particularly problematic in sealed enclosures. In enclosures that hold electronics that have a low operating power, temperature rise due to solar loading can far exceed temperature rise due to self-heating of the electronics.

To overcome this and other disadvantages, the present invention provides a heat sink that is operatively connected to the electronics whose temperatures need to be regulated, e.g., cooled. Generally, the present invention comprises an inner enclosure that isolates the electronics from the outside environment. The inner enclosure includes a first ventilated compartment and a second, sealed compartment. The ventilated inner compartment preferably includes the electronics.

The inner enclosure, in turn, is surrounded by an outer enclosure that includes perforations over at least a portion of its surface area. The perforations are configured and dimensioned such that air is capable of passing into a space between the inner and outer enclosures. The flow of air around the inner enclosure allows heat to be dissipated, cooling the electronics positioned within it. At the same time, the perforations are configured and dimensioned such that the inner enclosure is shielded from solar radiation. Preferably, the perforations prevent the entry of insects, such as bees and wasps, into the space between the inner enclosure and the outer enclosure.

According to one aspect, the outer enclosure comprises a mounting bracket that includes perforations. The heat sink is preferably exposed to an inner area formed by the mounting bracket, which encloses the back portion of the inner enclosure. One advantage of this configuration is that the air flow around the heat sink is maximized, allowing heat from the heat sink to dissipate by natural convection. One example of an outer enclosure that includes a mounting bracket that may be used in combination with the present invention is disclosed in a co-pending U.S. application, entitled "Electronics Enclosure With Solar Shield," the entirety of which is incorporated herein by reference.

The inner enclosure may house any type of equipment. Preferably, electronic equipment is housed within the enclosure. However, it is contemplated that other non-electronic hardware may also be enclosed. The non-electronic equipment may comprise materials that support or otherwise interact with the electronic equipment.

In one embodiment, the inner enclosure may comprise any material known to those skilled in the art. Materials that may be used include, but are not limited to, metal, alloys, wood, glass, composites, fiberglass, plastic, and the like. The inner enclosure, including its component parts, may have any desired dimensions, as will be appreciated by those skilled in the art, and the present invention is not intended to be limited to any dimensions, shapes, or the like. In other words, the height, width, depth, and shape of the inner enclosure may be chosen according to a particular application. Factors that may be considered include, but are not limited to, the type of electronic equipment enclosed, the dimensions of the electronic equipment and/or hardware enclosed, the space available outside a residence, and the like.

FIG. 1 is a diagram showing an overview of one embodiment of the present invention. As mentioned above, one embodiment of the present invention comprises a inner enclosure 10, or housing. The inner housing 10 includes a first ventilated compartment 12 and a second sealed compartment 14. The first ventilated compartment 12 includes the electronics 16, e.g., a PCB assembly, and an inner cavity 18. Air from the inner cavity 18 dissipates into the cavity 20 of the second sealed compartment 14. Towards the rear of the inner enclosure 10 is included a heat sink 22 that is operatively connected to the electronics 16. In this embodiment, the heat sink 22 is exposed to the cavity 24 of the mounting bracket 26, which is part of the outer enclosure. The mounting bracket 26 is preferably attached to a wall 28 of a residence such that an air gap 30 remains between the bracket 26 and the wall 28. This facilitates the movement of air, and as a consequence, the ability of the present invention to reduce the temperature of the electronics 16.

Figure 2:
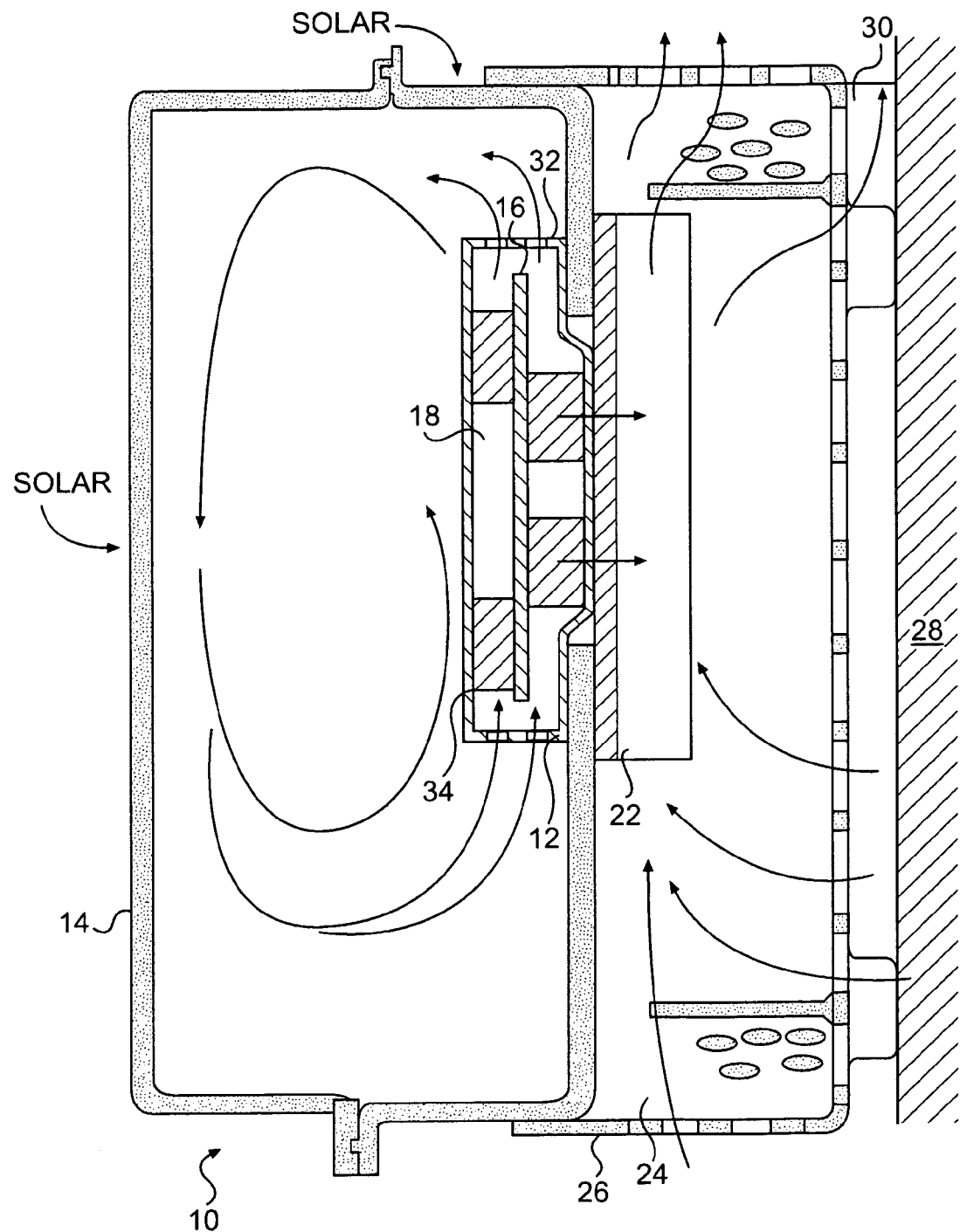
FIG. 2 shows a more detailed diagram of the FIG. 1 embodiment.

The present invention may be used in combination with any heat sink known to those skilled in the art. The heat sink may comprise any material known to those skilled in the art including, but not limited to, metals, alloys, composites, and the like. The heat sink may also comprise any desired dimensions or shape known to skilled artisans. A more detailed diagram of one embodiment of the present invention is shown in FIG. 2. As shown in the FIG. 2 embodiment, the first ventilated compartment 12 of the inner enclosure 10 comprises the electronics 16. The first ventilated compartment preferably includes one or more openings 32 that allow air to flow into the second sealed compartment 14 of the inner enclosure 10.

In addition, the present invention preferably includes an apparatus for transferring heat generated by the electronics 16 to the first ventilated compartment 12. In one embodiment, any material for transferring heat may be used. Materials that may be used include, but are not limited to, metal, alloys, composites, and the like. Preferably, the material is capable of forming a thermal conductive bond 34 between the electronics 16 and the first ventilated compartment 12. One advantage of using a material that forms a thermal conductive bond 34 is that heat from the electronics 16 can be efficiently transferred to the walls of the first ventilated compartment 12. The heat that is transferred to the walls of the ventilated compartment 12 may then be transferred to the cavity 20 of the second sealed compartment, or towards the rear it may be transferred to the heat sink 22.

According to one aspect of the present invention, the second sealed compartment 14 comprises an opening in its back wall, as illustrated in FIG. 2. The first ventilated compartment 12 is attached to portions of the back wall of the second compartment 14. Portions of the first ventilated compartment 12 may optionally protrude by a predetermined amount from the back wall of the second compartment 14. As shown in FIGS. 1 and 2, a heat sink 22 is preferably operatively connected to the opposite side of the back wall of the second compartment 14. In addition, the heat sink 22 is preferably in contact with the back portion of the first ventilated compartment 12, as illustrated in FIG. 2. Both the first ventilated compartment 12 and the heat sink 22 may be secured to the wall of the second compartment 14, and each other, using any method or apparatus known to those skilled in the art. For example, mechanical means, e.g., screws, nails, fasteners, hinges, clamps, latches, pins, rivets, grommets, and the like, or adhesives, e.g., glue, epoxy, resin, acrylics, polyurethanes, silicones, phenolics, polyimides, hot melts, plastisols, and the like, may be used separately or in combination.

In one embodiment, it is desirable for the second compartment 14 to be sealed, i.e. isolated from environmental conditions, e.g., wind, dust, moisture, and the like. As such, it is desirable for a seal to be formed between the heat sink 22 and the wall of the second sealed compartment 14. As shown in FIG. 2, the heat sink 22 protrudes into the cavity 24 of the mounting bracket 26. The perforations in the mounting bracket 26 allow air to flow into the cavity 24. As the air flows into, and out of the cavity 24, natural conduction allows the heat from the heat sink 22 to be transferred to the air. As the air passes back out of the perforations of the mounting bracket 26, the heat dissipates, thereby removing the heat generated by the electronics 16. In other embodiments, an unsealed second compartment 14 may be used.

As mentioned above, it is desirable for the second compartment 14 to be sealed so that the electronic component 16 may be isolated from environmental conditions, e.g., dust, moisture, dirt, wind, and the like. In some embodiments, the second compartment 14 may comprise plastic. In such an embodiment, the first ventilated compartment preferably comprises a metal. According to one aspect of the present invention, the first ventilated compartment preferably includes a heat sink. In other words, the heat sink is preferably formed as part of the first ventilated compartment. In this embodiment, the heat sink may be manufactured in any manner known to those skilled in the art, e.g., extruded or die-cast.

Figure 3:
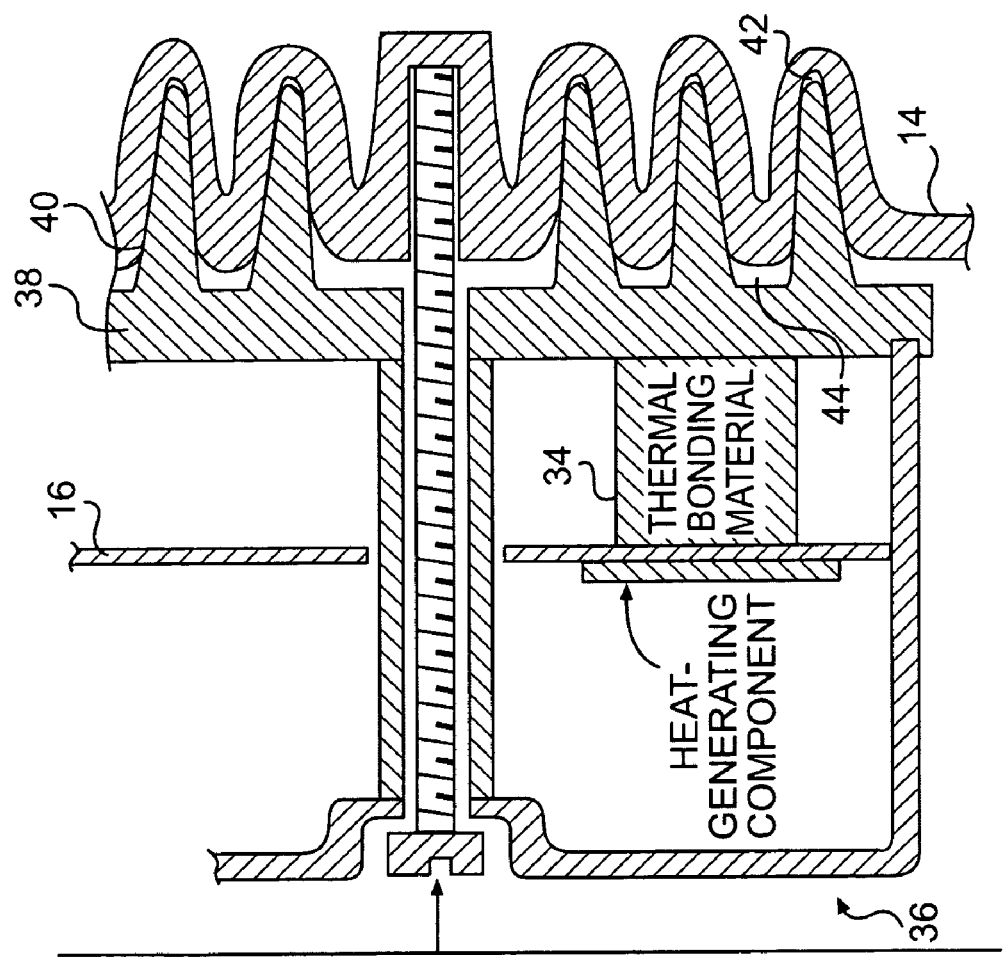
FIG. 3 shows a cross-section of a top view of another embodiment of the present invention.

FIG. 3 is a diagram showing one exemplary embodiment according to another aspect of the present invention. According to this aspect, the first ventilated compartment 36 includes a heat sink 38. The heat sink preferably comprises a non-planar surface. In one embodiment, the non-planar surface comprises a plurality of protrusions, e.g., fins 40, as shown in FIG. 3. One advantage of using a heat sink 38 that includes fins 40 is that the surface area for heat transfer may be increased. In other embodiments, the heat sink 38 may comprise any desired structure that increases the surface area exposed to the air. In this embodiment, a portion of the rear wall of the second sealed compartment 14 is configured and dimensioned such that its shape corresponds to the fins 40 of the heat sink 38.

In one embodiment, the rear wall of the second compartment 14 is preferably configured and dimensioned such that an air gap 42 is formed between the peak of the fins 40 and the peak of the outer housing 14. Similarly, an air gap 44 is formed between the valley between the peaks of the fins 40 and the valley between the peaks of the second compartment 14. The air gaps 42, 44 allow for the present invention to account for the differential thermal expansion of the heat sink 38 and the second compartment 14 to be accounted for. In other words, if the heat sink 38 comprises a first material, e.g., metal, and the second compartment 14 comprises a second, different material, e.g., plastic, the materials will expand by different amounts when exposed to heating and cooling. Thus, forming air gaps 42, 44 between the fins 40 and the second compartment 14 allows each material to expand and contract without causing the material that is less structurally sound, e.g., the plastic, from having its structural integrity compromised. Skilled artisans will recognize that the air gaps 42, 44 may comprise any desired dimensions, which may vary based on the type of non-planar surface employed.

In one aspect of the present invention, the first compartment 36 may be secured to the second compartment 14 using any means known to those skilled in the art. For instance, in one embodiment any mechanical means may be used to secure the two compartments 14, 36 including, but not limited to, fasteners, screws, nails, clamps, latches, pins, rivets, grommets, and the like. Alternately, any adhesive means may be used including, but not limited to, glue, epoxy, resin, acrylics, polyurethanes, silicones, phenolics, polyimides, hot melts, plastisols, and the like.

This embodiment of the present invention provides the advantage of eliminating the need for a seal to be formed between the heat sink and the back wall of the first compartment. This embodiment of the present invention operates in a similar manner as described above. That is, the rear wall of the second compartment 14 that is attached to the heat sink 38 protrudes into the cavity 24 of the mounting bracket 26. As air flows into the cavity 24 through the perforations in the mounting bracket 26, heat is transferred to the air through convection. In this manner, the temperature of the electronic components 16 may be dissipated.

One advantage of the present invention is that the heat sink's exposure to solar radiation is substantially minimized, as discussed in co-pending U.S. application, entitled "Electronics Enclosure With Solar Shield," the entirety of which is incorporated herein by reference. At the same time, the solar radiation is exposed to air that flows in through the perforations in the outer enclosure. This allows heat from the heat sink to be transferred to the air via convection, reducing the temperature of the electronics.

In each embodiment, the inner and outer enclosures, and portions thereof, may be capable of being separated in order to provide access to, for example, the electronics or other components stored therein. In other words, though the inner enclosure includes a second sealed compartment, the sealed compartment may be configured and dimensioned such that it is capable of being opened when desirable.

Although the present invention has been described with reference to particular embodiments, it will be understood to those skilled in the art that the invention is capable of a variety of alternative embodiments within the spirit of the appended claims.

The invention claimed is:

1. An apparatus for cooling electronics, comprising:
   an enclosure comprising a first compartment and a second compartment, wherein the second compartment comprises an opening in one wall, wherein the first compartment includes electronics therein, and wherein a portion of the first compartment is selectively positioned within a cavity of the second compartment; and
   a heat sink operatively connected to a portion of the first compartment and a portion of the second compartment, wherein the operative connection between the heat sink and the portion of the second compartment forms a seal, and wherein the heat sink comprises a first part and a second part and a cavity between the first part and the second part.

2. The apparatus of claim 1, further comprising an outer enclosure operatively connected to the second compartment to surround the wall of the second compartment comprising an opening, wherein the outer enclosure comprises a plurality of perforations.

3. The apparatus of claim 2, wherein the connection between the outer enclosure and the second compartment forms a cavity into which the heat sink protrudes.

4. The apparatus of claim 3, wherein the exposure of the heat sink to solar radiation is substantially minimized.

5. The apparatus of claim 3, wherein heat is transferred from the heat sink to air in the cavity via conduction.

6. The apparatus of claim 1, wherein the electronics are operatively connected to the first compartment using one or more thermal conductive bonds.

7. The apparatus of claim 1, wherein a portion of the first compartment that is exposed to the cavity of the second compartment comprises two or more perforations.

8. An apparatus for cooling electronic devices, comprising:
   a first enclosure comprising a heat sink, wherein a portion of the first enclosure houses electronics therein; and
   a second sealed enclosure surrounding the first enclosure, wherein the heat sink of the first enclosure is operatively connected to a portion of the second sealed enclosure;
   wherein the heat sink comprises a plurality of protrusions and the portion of the second sealed enclosure operatively connected to the protrusions is configured and dimensioned to include a plurality of recesses that correspond to the plurality of protrusions.

9. The apparatus of claim 8, further comprising a thermal bond between the electronics and the heat sink.

10. The apparatus of claim 8, wherein the second sealed enclosure comprises plastic.

11. The apparatus of claim 8, further comprising a gap between the top of each of the plurality of protrusions and the bottom of each of the plurality of recesses.

12. The apparatus of claim 8, wherein the heat sink further comprises a plurality of recesses between the plurality of protrusions and the second sealed enclosure includes a plurality of protrusions corresponding to the plurality of recesses, further comprising a gap between the bottom of each of the plurality of recesses of the heat sink and the top of the plurality of protrusions of the second sealed enclosure.

13. The apparatus of claim 8, further comprising a third enclosure operatively connected to the second enclosure to form a cavity therebetween, wherein the outer enclosure comprises a plurality of perforations.

14. The apparatus of claim 8, wherein at least a portion of the heat sink protrudes into the cavity.

15. The apparatus of claim 13, wherein the exposure of the heat sink to solar radiation is substantially minimized.

16. The apparatus of claim 13, wherein heat is transferred from the heat sink to air in the cavity via conduction.

17. The apparatus of claim 8, wherein the first enclosure comprises a plurality of perforations.

18. An apparatus for cooling electronics, comprising:
   a first enclosure comprising a heat sink, wherein a portion of the first enclosure houses electronics therein; and
   a second enclosure surrounding the first enclosure, wherein the heat sink of the first enclosure contacts a portion of the second enclosure;
   wherein the surface of the heat sink that contacts a portion of the second enclosure is non-planar.

19. The apparatus of claim 18, further comprising a third enclosure operatively connected to the second enclosure to form a cavity therebetween, wherein the outer enclosure comprises a plurality of perforations.

* * * * *